United States Patent [19]
Dudasko et al.

[11] Patent Number: 6,088,474
[45] Date of Patent: Jul. 11, 2000

[54] INSPECTION SYSTEM FOR MICROMECHANICAL DEVICES

[75] Inventors: David V. Dudasko, Richardson; George L. Streckmann, Dallas; Dennis L. Doane, Richardson; Anthony S. Leonard; Paul G. Barker, both of Dallas; Donald E. Russell, Richardson, all of Tex.

[73] Assignee: Texas Instruments Incorporated, Dallas, Tex.

[21] Appl. No.: 08/899,127

[22] Filed: Jul. 23, 1997

Related U.S. Application Data

[60] Provisional application No. 60/016,103, Jul. 24, 1996.

[51] Int. Cl.$^7$ ........................................ G06K 9/00
[52] U.S. Cl. ............................................... 382/145
[58] Field of Search ................................. 382/141, 149, 382/145; 364/468.17, 428.28; 324/522, 118, 751, 770; 348/92, 93, 125, 126, 128, 133, 134; 437/227; 257/415

[56] References Cited

U.S. PATENT DOCUMENTS

| | | | |
|---|---|---|---|
| 5,532,615 | 7/1996 | Kondo et al. | 324/770 |
| 5,597,767 | 1/1997 | Mignardi et al. | 437/227 |
| 5,774,575 | 6/1998 | Tanaka et al. | 382/149 |
| 5,781,017 | 7/1998 | Cole, Jr. et al. | 324/751 |
| 5,786,621 | 7/1998 | Saif et al. | 257/415 |
| 5,790,400 | 8/1998 | Higuchi | 382/141 |
| 5,834,773 | 11/1998 | Brunner et al. | 250/310 |
| 5,841,893 | 11/1998 | Ishikawa et al. | 382/145 |
| 5,847,753 | 12/1998 | Gabello et al. | 348/92 |

*Primary Examiner*—Joseph Mancuso
*Assistant Examiner*—F. E. Cooperrider
*Attorney, Agent, or Firm*—Charles A. Brill; Wade James Brady III; Frederick J. Telecky, Jr.

[57] ABSTRACT

A visual inspection system (10) and method for inspecting the operation of micromechanical devices. The system has a vision system (16), a vision system controller (18), a system controller (20), an illumination system (12), a digital signal processor and a mounting stage (22). The objects undergoing inspection, either wafers or devices, are mounted under the visions system. A probe card is engaged to the object and power is provided. The vision system (16) records which elements or devices on the object begin operating at that voltage. The voltage is then incremented and the process continues until a determination is made as to the objects operability. The system can also be adapted to inspect micromechanical spatial light modulators by generating images with the modulator and capturing them with the image system. The digital signal processor then analyzes the images while the vision system moves to the next object to be inspected.

17 Claims, 2 Drawing Sheets

INSPECTION SYSTEM FOR MICROMECHANICAL DEVICES

This application claims priority under 35 U.S.C. 119 based upon Provisional Application Ser. No. 60/016,103, filed Jul. 24, 1996.

BACKGROUND OF THE INVENTION

1. Field of the Invention

This invention relates to visual inspection systems, more particularly to inspection systems for micromechanical devices.

2. Background of the Invention

Visual inspection systems can be used to inspect electronic integrated circuits and devices. The inspection systems help the manufacturer verify that all of the parts are present and undamaged, or if they are operable, depending upon the device being inspected.

These types of inspection systems typically include a vision system, a controller, such as a personal computer, and a stage for loading the device under the vision system for inspection. Some devices have unique requirements that are not met by current visual inspection systems. One example of these are micromechanical devices.

These devices are unique because of their size and their operating characteristics. Some integrated circuits that do not require visual inspection can be tested by probe cards and voltage characterizations. Some devices must be inspected visually. Micromechanical devices need both.

Because these devices typically have moving parts, the vision system checks for defects in the moving parts. Additionally, since these devices are usually activated by voltage, their voltage characteristics must be tested.

One type of micromechanical device that exemplifies these needs is a micromechanical spatial light modulator. These modulators typically have an active surface that moves in response to a signal, thereby modulating incident light into an image. Examples of these include digital micromirror device (DMD™) or the actuated mirror array (AMA™). Both of these are reflective spatial light modulators. Transmissive spatial light modulators are less complicated to inspect, since one just lays them on the inspection stage and shines light through them to verify operation. With reflective spatial light modulators, the light must comes in at an angle and reflects up the appropriate optical axis to the vision system. Additionally, the moving parts of these devices must have proper electrical connection. However, all types of micromechanical devices would benefit from this type of inspection.

Therefore, some type of visual inspection system is required that can perform both visual inspection and operational testing.

SUMMARY OF THE INVENTION

In one aspect of the invention, a visual inspection system that inspects the operation of the devices visually and electrically is provided. The operation of the devices is verified by sampling devices across a wafer or individual elements on the devices. The voltage required for operation of the device is swept from zero to the maximum operating voltage and the vision system monitors the movement of the devices. The voltages at which the individual elements move are recorded and analyzed to determine defects.

In another aspect of the invention a visual characterization is performed for micromechanical spatial light modulators using an embodiment of the invention. In this embodiment, images are produced on the modulators, with the modulators remaining as part of the wafer, or as individual modulator devices. These images are then captured and analyzed by digital signal processors for defects in operation of the modulators.

It is an advantage of the invention in that it allows one system to verify operation of micromechanical devices both visually and electrically.

It is a further advantage of the invention in that the analysis of images is performed in parallel with testing, making the overall process relatively fast.

BRIEF DESCRIPTION OF THE DRAWINGS

For a more complete understanding of the present invention and for further advantages thereof, reference is now made to the following Detailed Description taken in conjunction with the accompanying Drawings in which.

DETAILED DESCRIPTION OF THE PREFERRED EMBODIMENTS

Figure 1:
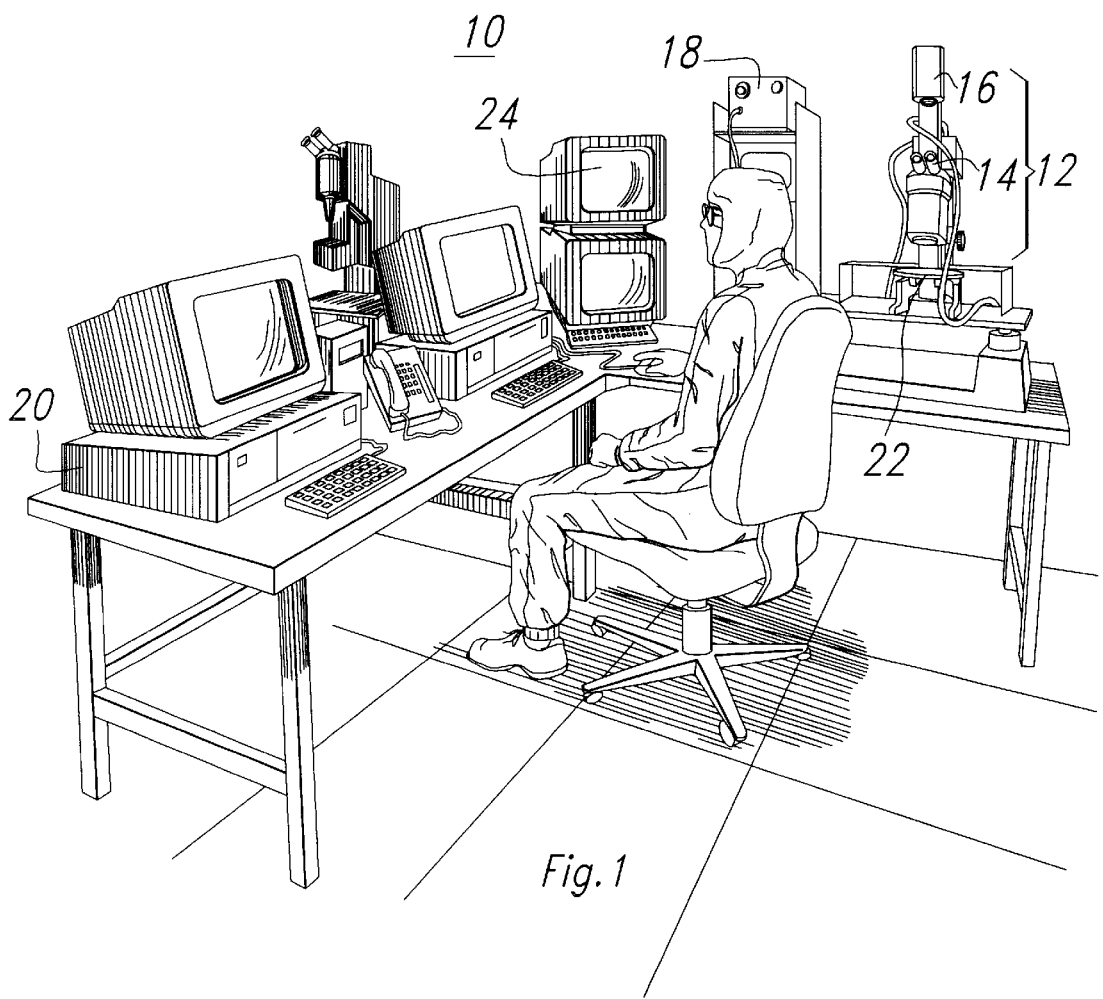
FIG. 1 shows a block diagram of a visual inspection system.

FIG. 1 shows a visual inspection system 10. The system comprises a vision system 12, having a camera or other input 14, an illumination system 16, a vision system controller 18, a system controller 20, and a stage 22 for mounting the devices undergoing inspection. The vision system may also have a monitor 24 that allows the operator to see what the camera or input to the vision system is seeing.

The vision system 12 is positioned over the devices or wafers mounted on the stage 22. The inspection system then inspects either the devices or the wafers electrically or visually. Wafers will be tested electrically, but the test will use the vision system. Micromechanical devices typically have moving parts. When the devices are powered up, the individual elements on the devices can be inspected by observing whether they are moving when powered.

Electrical testing typically occurs at the wafer level. Before the wafer is diced and the individual devices from the wafer are picked off, it is useful to know whether or not the devices have the proper electrical characterization. This characterization can include operating voltage determinations, areas on devices that have inoperable elements, and the number of electrically inoperable elements. Tolerance levels for each of these as well as other parameters may determine whether a device is picked from the wafer after dicing.

In the description of the preferred embodiments, distinction will be made between devices, elements and wafers. Wafer will refer to a semiconductor wafer. Device will refer to the individual integrated circuits formed upon the wafer. This is true even if the device being referred to has individual devices on it that are capable of functioning independently. These independently functioning devices will be referred to as elements.

For example, a wafer has upon it 60 micromotor array devices, each array being on one integrated circuit or chip. Each chip has an array of 800×600 micromotors. The micromotors will be referred to as elements, the arrays or chips as devices.

In a preferred embodiment of the invention, the inspection system has a vision system and illumination system that can inspect either the wafer or the devices individually. The vision system and the mounting stage must be movable. In the system as shown in FIG. 1, the mounting stage can move through the x (horizontal), y (vertical) and z axes. The z axis would appear to be coming out of the page. Additionally, to ensure proper alignment angles, the stage 22 is also rotatable through an angle θ. The vision system input can move in the x, y and z directions. These ensure proper alignment of the device or wafer prior to beginning inspection.

The input to the vision system, typically a camera, may be used with a microscope. The word "camera" as used here merely consists of a means for transferring the visual image of the device or wafer undergoing inspection to the vision system controller. The microscope is useful in allowing the operator to directly view the device or wafer undergoing inspection.

Figure 2:
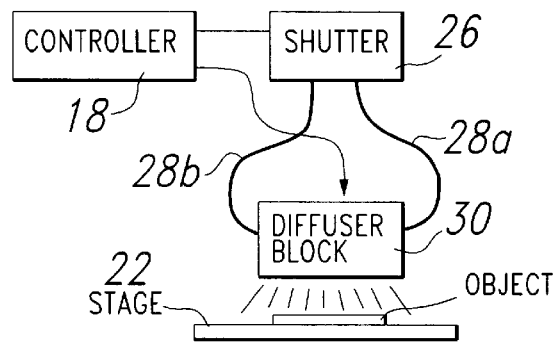
FIG. 2 shows a detailed block diagram of the vision system.

Because the vision system input is directly over the device, on-axis, illumination without shadows may also be a problem. This is especially true when the devices move, as in micromechanical devices, and even more so when images are being generated using micromechanical spatial light modulators. One example of an illumination system that avoids these types of problems is shown in FIG. 2.

This output of the illumination system, diffuser block 30, is mounted as shown in FIG. 1, between the input to the vision system and the piece undergoing inspection (object). The light is provided to the output via two fibers 28a and 28b, or directly on-axis through a shutter at the light source. The shutter setting determines the path traveled by the light to the output. The two fibers are useful for devices with moving elements, since they produce light off-axis.

One type of device for which this type of illumination is especially useful is the micromechanical spatial light modulator. These modulators typically have a 10° tilt in two directions. For discussion purposes, these directions will be assumed to be to the left and the right of the drawing in FIG. 2. For example, the light travels onto the device along the first fiber 28a. Elements of the device tilted to the right of the drawing will reflect light directly on-axis to the vision system. If the devices where switched to tilt to the left, the second fiber 28b would be used and the light would again move directly up the axis lo the input to the vision system. Which fiber receives the light is determined by the setting of the shutter 26.

Having shown the overall system and the illumination system for devices and wafer undergoing inspection, it is useful to discuss the two different types of inspection that can be performed using this system. At the wafer level, as mentioned previously, it is useful to perform a characterization of the electrical operation of the devices before picking them off of the wafer and packaging them as individual chips. However, this discussion is in no way intended to limit the applicability of the electrical tests to the wafer level. With one relatively small adaptation, the electrical operation of the devices may also be characterized.

In order to avoid differentiating between devices on wafers and individual devices themselves, the area undergoing electrical characterization will be referred to as the object of inspection or the object. At the wafer level, the object undergoing inspection will be a predefined region of a device on the wafer, or a predefined device. At the device level, the object will be a predefined region of the device in which are a selected number of elements.

Figure 3:
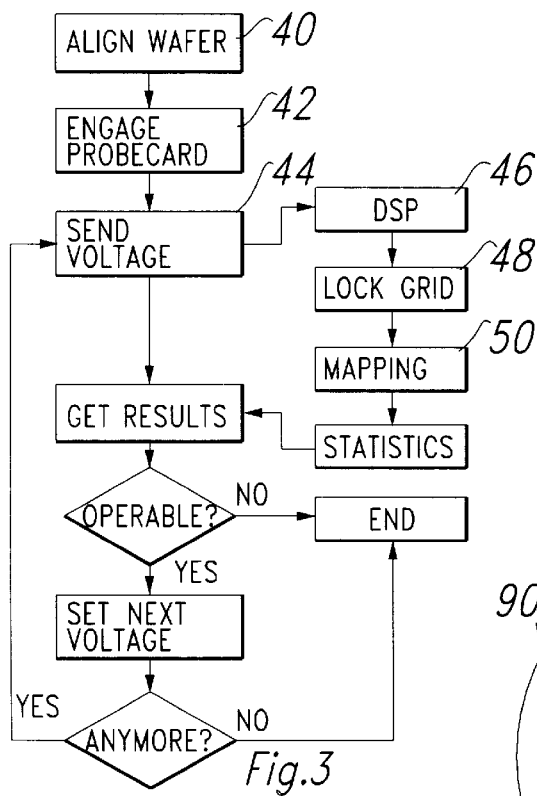
FIG. 3 shows a process flow for electrical verification of devices using a visual inspection system.

The process for electrical characterization is shown in FIG. 3. In this example, electrical characterization at the wafer level will be assumed. Again, this is in no way intended to limit electrical characterization to the wafer level only. In step 40, the wafer is aligned on the mounting stage and the camera positioned to verify that alignment. This can be done in several ways, typically using the grid of devices on the face of the wafer as location points. This will be discussed in more detail with regard to FIGS. 5a and 5b.

Once the wafer is aligned and the camera is positioned over a device on the wafer, the probe card is engaged to the device in step 42. The probe card makes contact with the connections and wires on the device to provide power for testing and to send signals if necessary to parts of the device. In step 44, the voltage is sent to the devices via the probe card. Depending upon the level of the voltage, some of the elements may begin to operate or move. The image of the devices and elements is captured and sent to the digital signal processor (DSP) in step 46. In step 48, the grid of the image is locked for analysis. Any defects, such as elements that operate when not expected, or that do not operate when expected, are mapped by the DSP in step 50. Statistics of the device operation are calculated in step 52 and the results are transmitted to the system controller (Get Results) in step 54.

If a device fails the voltage tests, it is deemed inoperable. At the wafer level, if a device fails, it can indicate that the entire wafer is inoperable and may halt the test at the point where one device fails. Regardless of the implication for the entire wafer, if that particular device on the wafer is inoperable at step 56, such as failure of the elements to perform properly at that voltage, the system terminates testing of that device at step 60. If the statistical analysis indicates that the device is operable, then the voltage is incremented in step 58 and the testing continues until the answer in steps 56 or 62 is NO.

One method of quickly characterizing the electrical operation of the wafer or device is to select a device in the center of the wafer, or a region in the center of the device and characterize that object. This would fit nicely into a process flow if one were also going to visually analyze the entire wafer, such as may be done with micromechanical spatial light modulators. The camera or input is positioned in the middle of the device or wafer and the electrical characterization is performed. The camera or input is then positioned at the start of the visual inspection grid, say for example, the lower left corner of the device or wafer. The electrical characterization is performed and, immediately after that, the visual inspection begins. This minimizes the number of position changes required of the vision system, thereby making the process faster.

Figure 4:
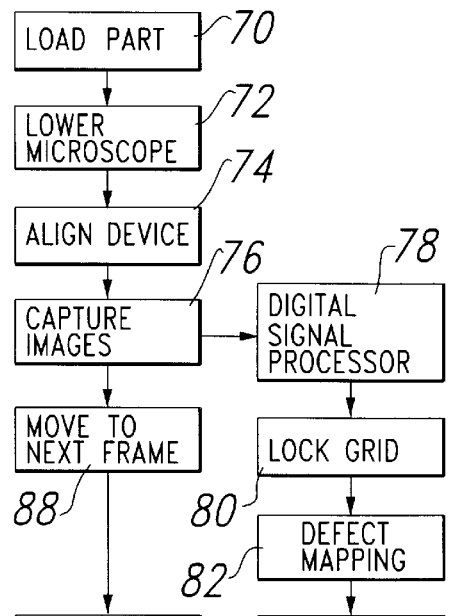
FIG. 4 shows a process flow for characterization of micromechanical spatial light modulators.

An example of a visual inspection process for micromechanical spatial light modulators is shown in FIG. 4. This example shows visual inspection at the device level. Again, this is in no way intended to limit visual inspection at the wafer level. When and at what level both the electrical characterization and the visual inspections are performed is left up to the system designer and may take into consideration such things as cost of the device and the consequences for not verifying each device's operation.

The part is loaded in step 70. Since this example uses the device rather than the wafer, the microscope and input to the vision system will more than likely need to be lowered as in step 72, bringing the device into focus and making the image large enough for analysis. The device is aligned in step 74. If the example of using the lowest and furthest left region of the device is used, this step would involve positioning the vision system input over that region.

In step 76, test images are generated to test the device. As mentioned earlier, micromechanical spatial light modulators typically involve tilling mirrors or other types of reflective surfaces. They have at least two directions, an ON direction and OFF direction. Referring back to FIG. 2, we will assume for discussion purposes that when the devices tilt to the right they are ON. Using the region of the device over which the camera is positioned, images are generated and captured in step 76.

One method of testing all of the elements in that region is to generate 6 images. Two checkerboard patterns are generated, one illuminated by each fiber from FIG. 2. Next, the entire device is turned ON. It is illuminated by the first fiber, then the second. Notice that if the right side is the ON direction, when the device is illuminated from the left side all of the elements would appear OFF since no light will reach the input of the inspection system. Finally, the entire device is turned OFF twice, once for each fiber.

After these images are generated and captured in step 76, they are transferred to the digital signal processor (DSP) in step 78. The DSP performs analysis of these images while the rest of the inspection system continues to analyze the other regions on the device. The DSP locks the grid to orient the images for analysis in step 80, and produces a defect map in step 32. The defective elements become apparent during the generation of the images. If, for example, one of the elements is stuck ON, it will generate a bright spot on the image when the device is supposed to be turned OFF. The defects could be one of many conditions: stuck ON; stuck OFF; stuck flat; only able to turn ON from flat; and only able to turn OFF from flat. The flat state is the intermediate state between the ON and OFF states. The element is obstructed and cannot turn either ON or OFF.

Statistics are then run on the defect map in step 84 to determine whether that region passes the tests. The tests set tolerances for allowable defects or number of defects. The results are then sent to the system controller (Get Results) in step 86.

Meanwhile, the vision system continues to receive images from the next region while the DSP is processing. At step 88, the next region is activated to generate its images in parallel with the analysis of the previous region's images. This allows for a faster processing of the device through the inspection.

The vision system input can be programmed to move in any pattern that is the most efficient. This may depend upon the wafer or device size and layout. One example for these patterns is shown in FIGS. 5*a* and 5*b*.

Figure 5A:
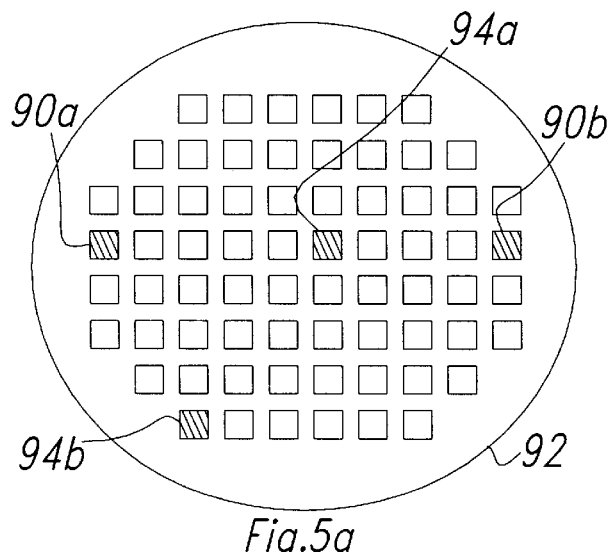
FIGS. 5a and 5b show patterns of testing for wafers and individual devices, respectively.

In FIG. 5*a*, a wafer is shown with two devices used for alignment. In aligning the wafer, as was done in FIG. 3, the bottom edges of two devices on opposite sides of the wafer are found. The angle 0 can then be adjusted to ensure that the wafer is aligned correctly. These devices 90*a* and 90*b* are shown in FIG. 5*a* on the wafer 92. Alignment can be done in many ways and this is only intended as an example.

As mentioned previously, the electrical characterization on the wafer level can be performed on any number of devices that the system designer determines. One example used previously was to characterize a middle device and the lower left hand device. These devices are shown as devices 94*a* and 94*b*, respectively.

Figure 5B:
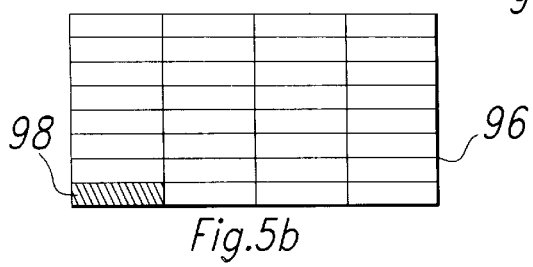

In FIG. 5*b*, an example of an inspection grid is shown. The device is typically rectangular, and the regions to be inspected are likewise rectangular.

If, for example, the device 96 shown in FIG. 5*b* is a standard NTSC resolution spatial light modulator, it would have 640 columns of elements, and 480 rows. If the inspection pattern is laid out as 4 regions wide by 8 regions long, each region 98 would have 160 columns and 60 rows. One example of an inspection pattern starts at region 98 and moves laterally across the device to the right until the end of that row is reached. It would then move up to the next row and move back across the device to the left until the end of the row, repeating until the entire device has been inspected.

If the test for image generation were run on the wafer level, the inspection grid could be based upon the devices, or on regions of the devices. Similarly, if the electrical characterization was done on the device level, instead of selecting the middle device on a wafer, the system could select the middle region on a device.

These embodiments of the inspection system allow the manufacturer of micromechanical devices to test the electrical activation of the mechanical parts of elements on the devices. For micromechanical spatial light modulators, it also allows the manufacturer to determine the working devices and regions within each device for image generation.

The inspection system and vision system controller are fully automated, thereby allowing the operator to merely monitor the processes and load new wafers and devices as needed. This also lead to accurate defect mapping and results of the inspections.

Thus, although there has been described to this point a particular embodiment for a system and process for micromechanical device inspection, it is not intended that such specific references be considered as limitations upon the scope of this invention except in-so-far as set forth in the following claims.

What is claimed is:

1. A method for inspecting micromechanical devices, comprising the steps of:

(a) providing a semiconductor device containing movable micromechanical elements as a part thereof which are movable in response to predetermined voltages applied to said semiconductor device;

(b) selecting a first micromechanical element of said micromechanical elements in a first region on said device for inspection;

(c) sending a first predetermined voltage to said first micromechanical element to provide said micromechanical element with power;

(d) capturing an image of the response of said first micromechanical element to said first predetermined voltage;

(e) optically analyzing said image to determine if said micromechanical element is operational at said first predetermined voltage;

(f) incrementing said voltage to a second predetermined voltage different from said first predetermined voltage;

(g) repeating said steps of sending, capturing and optically analyzing; and (h) selecting a second micromechanical element in a second region on said device and repeating all of said steps (c) through (g) on said second micromechanical element until a characterization of electrical operation of each of said micromechanical elements has been produced.

2. The method of claim 1, wherein said micromechanical device is a wafer.

3. The method of claim 1, wherein said micromechanical device is a micromechanical spatial light modulator.

4. A method for inspecting micromechanical spatial light modulators, comprising the steps of:
   (a) providing a semiconductor device having a plurality of reflective objects to be tested, each of said reflective objects being mechanically positionable in response to a predetermined signal applied to said semiconductor device;
   (b) positioning an input to a vision system adjacent a predetermined one of said reflective objects to be tested;
   (c) producing a series of optical test images on said reflective object to be tested in response to a series of at least two different signals applied to said semiconductor device;
   (d) capturing an indication of said test images at said input reflected to said vision system;
   (e) storing said indication of said reflected test images;
   (f) transferring said indication of said reflected test images to a digital signal processor;
   (g) moving said input to be adjacent to a new reflective object to be tested;
   (h) analyzing said indication of said test images in parallel with said moving step and producing results of said analysis; and
   (i) repeating all of the above steps until all objects have been analyzed, or a result is reached that indicates that an object is inoperable.

5. The method of claim 4 wherein said series of test images includes at least one ON image.

6. The method of claim 4 wherein said series of test images includes at least one OFF image.

7. The method of claim 4 wherein said series of test images includes a checkerboard pattern.

8. An automated inspection system for micromechanical devices, comprising:
   (a) said system of micromechanical devices coupled to and controlled by a semiconductor device, each of said micromechanical devices having a reflective element;
   (b) a system controller operable to receive user inputs on operation of said system;
   (c) a vision system for viewing said micromechanical devices and individual reflective elements on said micromechanical devices;
   (d) a vision system controller operable to monitor and analyze operation of said micromechanical devices and said elements, including:
   (e) an input for capturing reflected images from said micromechanical devices and said elements;
   (f) a memory for storing indicia of said reflected images;
   (g) a digital signal processor for analyzing said indicia of said reflected images; and
   (h) a mechanical controller for moving said input in response to a predetermined condition; and
   (i) a stage for mounting said semiconductor devices.

9. The method of claim 1 wherein said step of optically analyzing includes the steps of optically analyzing includes the steps of shining a reflectable light on the object, receiving light reflected from the object and determining the degree of reflection of the light from the object.

10. The method of claim 2 wherein said step of optically analyzing includes the steps of shining a reflectable light on said object, receiving light reflected from said object and determining the degree of reflection of said light from said object.

11. The method of claim 3 wherein said step of optically analyzing includes the steps of shining a reflectable light on said object, receiving light reflected from said object and determining the degree of reflection of said light from said object.

12. The method of claim 1 further including the steps of engaging a probe card on said wafer and applying said voltage through said probe card.

13. The method of claim 2 further including the steps of engaging a probe card on said wafer and applying said voltage through said probe card.

14. The method of claim 3 further including the steps of engaging a probe card on said wafer and applying said voltage through said probe card.

15. The method of claim 9 further including the steps of engaging a probe card on said wafer and applying said voltage through said probe card.

16. The method of claim 10 further including the steps of engaging a probe card on said wafer and applying said voltage through said probe card.

17. The method of claim 11 further including the steps of engaging a probe card on said wafer and applying said voltage through said probe card.

* * * * *